United States Patent
Meiser et al.

(10) Patent No.: US 10,868,146 B2
(45) Date of Patent: Dec. 15, 2020

(54) METHOD FOR PRODUCING A SEMICONDUCTOR DEVICE HAVING A SUPERJUNCTION STRUCTURE, FIRST AND SECOND TRENCHES AND A TRENCH STRUCTURE IN THE SECOND TRENCH

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/408,755

(22) Filed: May 10, 2019

(65) Prior Publication Data

US 2019/0348525 A1     Nov. 14, 2019

(30) Foreign Application Priority Data

May 11, 2018 (DE) .................. 10 2018 111 326

(51) Int. Cl.
*H01L 29/06* (2006.01)
*H01L 29/66* (2006.01)
(Continued)

(52) U.S. Cl.
CPC .... *H01L 29/66734* (2013.01); *H01L 21/0274* (2013.01); *H01L 29/0634* (2013.01); *H01L 21/22* (2013.01); *H01L 21/477* (2013.01)

(58) Field of Classification Search
CPC ............. H01L 29/4236; H01L 29/7816; H01L 29/7825; H01L 29/66704; H01L 29/66734; H01L 29/7813; H01L 29/7393; H01L 29/7397; H01L 21/027; H01L 21/0273; H01L 21/0274; H01L 21/0332–0337; H01L 21/266; H01L 21/308; H01L 21/3081; H01L 21/3083; H01L 21/3086;
(Continued)

(56) References Cited

U.S. PATENT DOCUMENTS 7,595,242 B2    9/2009   Nakazawa et al.
2015/0035051 A1*   2/2015   Hebert ............... H01L 29/0878
                                              257/334
(Continued)

FOREIGN PATENT DOCUMENTS

DE         102010060229 B4    9/2014

*Primary Examiner* — Sonya McCall-Shepard
(74) *Attorney, Agent, or Firm* — Murphy, Bilak & Homiller, PLLC (57) ABSTRACT

The disclosure relates to a method for producing a semiconductor device. The method includes providing a semiconductor body having first dopants of a first conductivity type and second dopants of a second conductivity type. The method also includes forming a first trench in the semiconductor body via a first mask, and filling the first trench with a semiconductor filling material. The method further includes forming a superjunction structure by introducing a portion of the first dopants from a region of the semiconductor body into the semiconductor filling material, forming a second trench in the semiconductor body via a second mask, which is formed in a manner self-aligned with respect to the first mask, and forming a trench structure in the second trench.

16 Claims, 11 Drawing Sheets

(51) Int. Cl.
*H01L 21/027* (2006.01)
*H01L 21/477* (2006.01)
*H01L 21/22* (2006.01)

(58) Field of Classification Search
CPC ..... H01L 21/18; H01L 21/182; H01L 21/185; H01L 21/22; H01L 21/477; H01L 21/324; H01L 21/3242; H01L 21/34; H01L 21/38; H01L 21/02494–0251; H01L 29/0634
See application file for complete search history.

(56) References Cited

U.S. PATENT DOCUMENTS

| | | | |
|---|---|---|---|
| 2017/0154956 A1* | 6/2017 | Weber | H01L 21/0274 |
| 2019/0051488 A1* | 2/2019 | Schustereder | H01L 21/2253 |
| 2019/0088482 A1* | 3/2019 | Schulze | H01L 21/2205 |

* cited by examiner

METHOD FOR PRODUCING A SEMICONDUCTOR DEVICE HAVING A SUPERJUNCTION STRUCTURE, FIRST AND SECOND TRENCHES AND A TRENCH STRUCTURE IN THE SECOND TRENCH

TECHNICAL FIELD

The application relates to a method for producing a semiconductor device.

BACKGROUND

In semiconductor devices having field effect transistors in the reverse voltage range of from a few tens to a few hundreds of volts, use is made of field plate trench field effect transistors, for example. Improving the area-specific on resistance Ron×A is the subject of the further development of field effect transistors of this type. In this case, by way of example, it is necessary to make compromises in the device properties required, since altering a device parameter can have varying effects on the device properties, e.g. can lead to an improvement of one device property with simultaneous deterioration in another device property. In this regard, by way of example, raising the dopant concentration in the drift zone can lead to a desired reduction of the area-specific on resistance Ron×A, but entail an undesired decrease in the voltage blocking capability between source and drain. Against this background, this application is concerned with a method for producing a field effect transistor having an improved area-specific on resistance Ron×A.

SUMMARY

The present disclosure relates to a method for producing a semiconductor device. The method comprises providing a semiconductor body comprising first dopants of a first conductivity type and second dopants of a second conductivity type. The method additionally comprises forming a first trench in the semiconductor body by means of a first mask, and filling the first trench with a semiconductor filling material. The method furthermore comprises forming a superjunction (SJ) structure by introducing a portion of the first dopants from a region of the semiconductor body into the semiconductor filling material, forming a second trench in the semiconductor body by means of a second mask, which is formed in a manner self-aligned with respect to the first mask, and forming a trench structure in the second trench

BRIEF DESCRIPTION OF THE DRAWINGS

The accompanying drawings serve to provide an understanding of exemplary embodiments of the invention, are included in the disclosure and form a part thereof. The drawings merely illustrate exemplary embodiments and together with the description serve to elucidate same. Further exemplary embodiments and numerous advantages from among those intended are directly evident from the following detailed description. The elements and structures shown in the drawings are not necessarily illustrated in a manner true to scale with respect to one another. Identical reference signs refer to identical or mutually corresponding elements and structures.

DETAILED DESCRIPTION

In the following detailed description, reference is made to the accompanying drawings, which form part of the disclosure and show specific exemplary embodiments for illustration purposes. In this context, a direction terminology such as "top side", "bottom", "front side", "rear side", "at the front", "at the back", etc. is related to the orientation of the figures currently being described. Since the devices of the exemplary embodiments can be positioned in different orientations, the direction terminology serves only for explanation and should in no way be interpreted as limiting.

It goes without saying that further exemplary embodiments exist and structural or logical changes can be made to the exemplary embodiments, without in so doing departing from what is defined by the patent claims. The description of the exemplary embodiments is non-limiting in this respect. In particular, elements of exemplary embodiments described below can be combined with elements of others of the exemplary embodiments described, provided that nothing to the contrary is evident from the context.

The terms "have", "contain", "encompass", "comprise" and the like hereinafter are open terms which on the one hand indicate the presence of the stated elements or features, and on the other hand do not exclude the presence of further elements or features. The indefinite articles and the definite articles encompass both the plural and the singular, unless something to the contrary is clearly evident from the context.

The term "electrically connected" describes a permanent low-impedance connection between electrically connected elements, for example a direct contact between the relevant elements or a low-impedance connection via a metal and/or a highly doped semiconductor. The term "electrically coupled" includes the fact that one or more intervening elements suitable for signal transmission can be present between the electrically coupled elements, for example elements that are controllable in order to provide at times a low-impedance connection in a first state and a high-impedance electrical decoupling in a second state.

The figures may refer to relative doping concentrations by the indication of "−" or "+" next to the doping type "n" or "p". By way of example, "n$^-$" denotes a doping concentration which is lower than the doping concentration of an "n"-type doping region, while an "n$^+$"-type doping region has a higher doping concentration than an "n"-type doping region. Doping regions of the same relative doping concentration do not necessarily have the same absolute doping concentration. By way of example, two different "n"-type doping regions can have the same or different absolute doping concentrations.

Insulated gate field effect transistors (IGFETs) are voltage-controlled devices such as metal oxide semiconductor FETs (MOSFETs), for instance. MOSFETs also include FETs having gate electrodes based on doped semiconductor material and/or gate dielectrics that are not, or not exclusively, based on an oxide.

Figure 1:
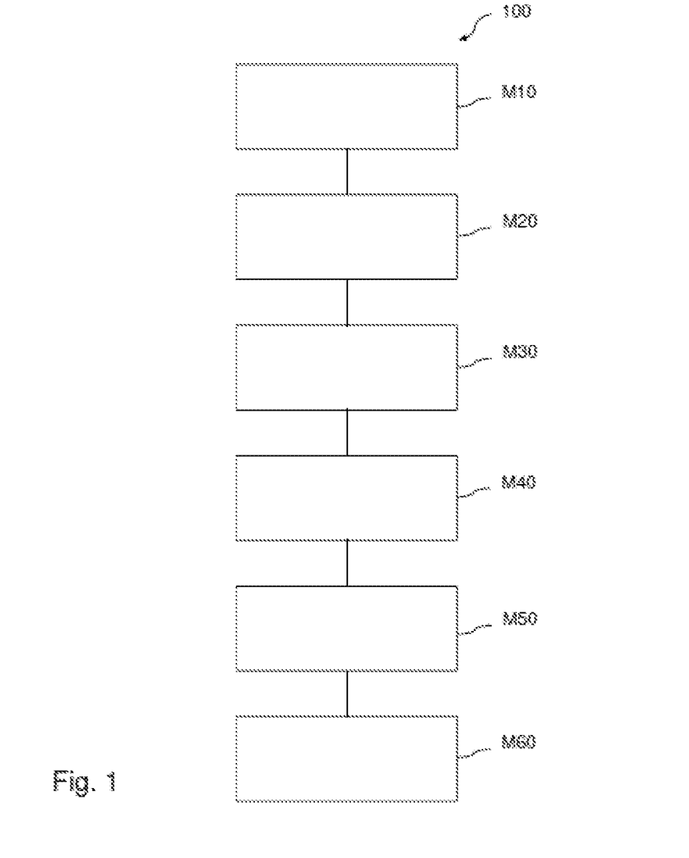
FIG. 1 shows a schematic flow diagram 100 for illustrating one exemplary method for producing a semiconductor device.

FIG. 1 illustrates a schematic flow diagram 100 for producing a semiconductor device in accordance with one exemplary embodiment.

The flow diagram 100 comprises method features, each of which can comprise one or a plurality of processing steps. During the production of the semiconductor device, further processing steps can follow, e.g. before, between or else after the method features shown. Likewise, further processing steps can be carried out between the processing steps assigned to a method feature or else together with the processing steps described. In this regard, by way of example, a processing step of forming a trench by means of a mask, which processing step is assigned to a method feature, can comprise an etching process that forms both the trench described and further trenches defined by way of the mask. Moreover, processing steps of different method features can be carried out jointly or in a different order.

A method feature M10 comprises providing a semiconductor body comprising first dopants of a first conductivity type and second dopants of a second conductivity type. The term "first dopants of a first conductivity type" denotes a multiplicity of a first dopant species of a first conductivity type, i.e. a multiplicity of a first dopant element such as, for instance, a multiplicity of phosphorus doping elements for the case where the first conductivity type is an n-type. It goes without saying that the first conductivity type can also be a p-type, wherein in this case boron is one exemplary dopant element. Likewise, the term "second dopants" denotes a multiplicity of a second dopant species, i.e. a multiplicity of a second dopant element. If dopants are referred to as mutually different, then different dopant species are involved, e.g. phosphorus and arsenic if the different dopants are of the same conductivity type, or else, for instance, phosphorus and boron if the dopants are of different conductivity types.

The semiconductor body can comprise for example a semiconductor substrate, e.g. a wafer composed of a monocrystalline semiconductor material such as, for instance, silicon (Si), silicon-germanium (SiGe), silicon carbide (SiC) or else a III-V semiconductor material. The semiconductor body can additionally comprise no, one or else a plurality of semiconductor layers formed, for example, on the semiconductor substrate. The first and second dopants can be introduced into the semiconductor body for example by ion implantation, by diffusion from a diffusion source or else by in-situ doping during a layer deposition. It goes without saying that it is possible to use in each case a plurality of diffusion steps or else ion implantation steps or else a combination of diffusion and ion implantation steps for introducing the first and second dopants. A depth distribution of the first and second dopants can be obtained for example by means of ion implantations at different energies or else by means of a method in which epitaxy and implantation repeatedly alternate (so-called "multi-epi/multi-implant" method).

A method feature M20 comprises forming a first trench in the semiconductor body by means of a first mask. The first trench can be formed for example by one etching process or a combination of a plurality of etching processes, e.g. a physical dry etching method, a chemical dry etching method, a physico-chemical dry etching method such as reactive ion etching (RIE) or else a wet etching method. The first mask can be produced for example from one layer or else from a layer stack by means of photolithographic patterning. In this case, layer materials of a layer stack can be chosen for example in such a way that they can be etched selectively with respect to one another. Exemplary materials of a mask layer stack are oxides and nitrides.

A method feature M30 comprises filling the first trench with a semiconductor filling material. The semiconductor filling material can be produced for example by a layer deposition method such as chemical vapor deposition (CVD). By way of example, the trench is filled with the semiconductor filling material by a method which makes possible the filling with the highest possible crystal quality, e.g. epitaxial growth on the side and bottom surfaces of the first trench. A total dopant concentration in the semiconductor filling material, in an average value determined over the vertical extent of the first trench, can be more than two, or more than three, or else more than four, orders of magnitude less than a corresponding total dopant concentration in a region of the semiconductor body located next to the first trench, relative to the same vertical extent. The semiconductor filling material is thus an intrinsic semiconductor filling material, i.e. one that is doped only by impurities, but not intentionally, or else an intentionally weakly doped semiconductor filling material.

A method feature M40 comprises forming a superjunction (SJ) structure by introducing a portion of the first dopants from a region of the semiconductor body into the semiconductor filling material. Introducing the portion of the first dopants can be carried out for example by means of a thermal budget which brings about a process of diffusion of the portion of the first dopants from the region of the semiconductor body into the semiconductor filling material. The thermal budget can be set for example by means of a heatable process chamber, e.g. a furnace, by means of temperature profile and duration. In view of different diffusion coefficients of the first and second dopants and the different conductivity types of the first and second dopants, different amounts of first and second dopants pass into the semiconductor filling material. In the case of an approximately corresponding or only slightly deviating dose or average dopant concentration of the first and second dopants, this has the effect that a net doping of a conductivity type that is different than the conductivity type in the surrounding region of the semiconductor body arises in the semiconductor filling material. By way of example, if more first than second dopants diffuse into the semiconductor filling material, then a net doping of the conductivity type of the first dopants arises in the semiconductor filling material and more second dopants than first dopants are present in the part of the semiconductor body surrounding the semiconductor filling material and the net doping is of the conductivity type of the second dopants.

A method feature M50 comprises forming a second trench in the semiconductor body by means of a second mask, which is formed in a manner self-aligned with respect to the first mask. Forming the second mask in a manner self-aligned with respect to the first mask prevents a misalignment that arises if a mask is produced lithographically and is aligned relative to a previously lithographically produced other mask or structures formed therewith, e.g. by means of alignment marks. Consequently, only photolithography is required for producing the first mask and the second mask and the second mask is produced for example on the basis of the first mask, e.g. with an inverted mask structure with respect to the first mask. An inverted mask structure can be produced, for instance, by filling openings in the first mask with the material of the second mask and then removing, e.g. etching, the material of the first mask selectively with respect to the material of the second mask. Like the first trench, too, the second trench can be formed for example by one or a combination of a plurality of etching processes, e.g. a physical dry etching method, a chemical dry etching method, a physico-chemical dry etching method such as reactive ion etching (RIE) or else a wet etching method. The second mask can be produced for example from one layer or else from a layer stack by means of photolithographic patterning. In this case, layer materials of a layer stack can be chosen for example in such a way that they can be etched selectively with respect to one another.

A method feature M60 comprises forming a trench structure in the second trench. Forming the trench structure can comprise for example forming a gate dielectric in the second trench, e.g. by means of thermal oxidation and/or deposition of an oxide such as TEOS (tetraethyl orthosilicate), and also forming a gate electrode in the second trench, e.g. by deposition of doped polycrystalline silicon. The trench structure can thus be formed for example as a gate trench structure of an IGFET.

Figure 2A:
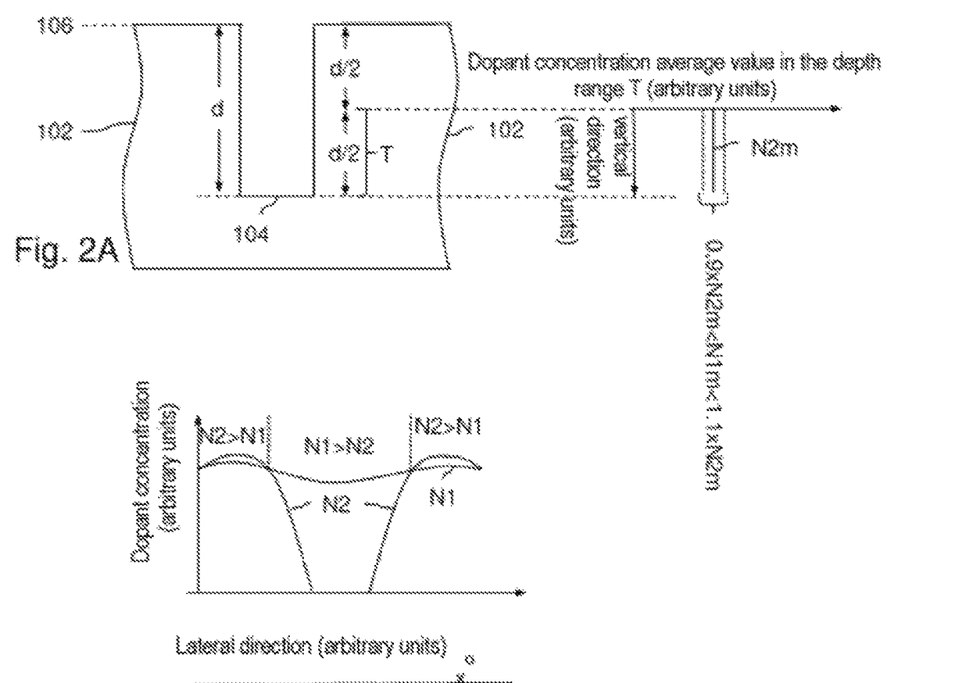
FIG. 2A shows a schematic cross-sectional view of a semiconductor body for illustrating dopant concentration average values of first and second dopants in the semiconductor body.

The cross-sectional view shown in FIG. 2A illustrates one exemplary embodiment in which a first trench 104 extends from a first surface 106 of the semiconductor body 102 vertically down to a depth d of the semiconductor body, and a dopant concentration average value of the first dopants N1m, which is determined along a vertical direction y in a depth range T of d/2 to d, deviates by less than 10%, or by less than 5%, from a dopant concentration average value of the second dopants N2m, which is determined along the vertical direction in the depth range of d/2 to d. A tolerable difference in the dopant concentration average value may be dependent here for example on a specified voltage blocking capability between load terminals such as source and drain, for instance, and also on the absolute value of the dopant concentration average values. The deviation of the dopant concentration average value of the first dopants N1m, relative to the dopant concentration average value of the second dopants N2m, is illustrated, in the schematic illustration in FIG. 2A as a range $0.9 \times N2m < N1m < 1.1 \times N2m$, identified by a bracket, and range limits for N1m illustrated by dashed lines. The relation between N1m and N2m makes possible, for example, a precise setting of the doping in the differently doped regions of the superjunction structure.

Figure 2B:
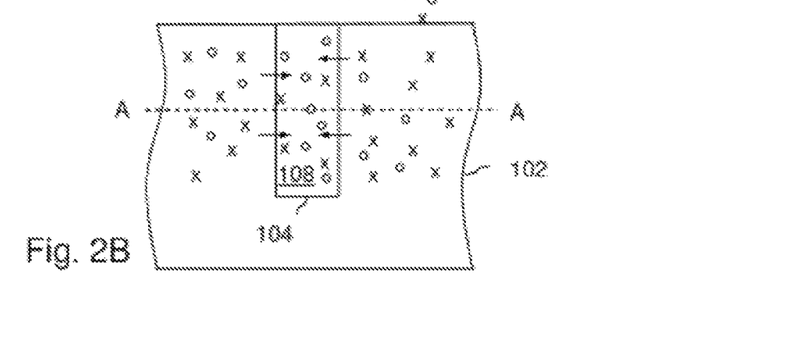
FIG. 2B shows a schematic cross-sectional view of the semiconductor body for illustrating the formation of a superjunction structure.

In accordance with one exemplary embodiment, a diffusion coefficient of the first dopants in the semiconductor body 102 is greater than a diffusion coefficient of the second dopants in the semiconductor body 102, and forming the superjunction structure comprises a thermal diffusion process, as a result of which more first than second dopants diffuse from the region of the semiconductor body 102 into the semiconductor filling material, such that the semiconductor filling material is at least partly of the first conductivity type and the semiconductor body region is at least partly of the second conductivity type. The exemplary embodiment is illustrated in a simplified manner in FIG. 2B on the basis of first dopants, identified schematically by the symbol "o", and second dopants, identified schematically by the symbol "x", for illustration purposes. More first dopants diffuse from the region of the semiconductor body 102 surrounding the first trench 104 along a lateral direction x into the semiconductor filling material 108 in the first trench 104. As is illustrated in the schematic diagram of the dopant concentration along the lateral direction x as shown in FIG. 2B, more first dopants than second dopants are present in a region of the semiconductor filling material 108. A background doping in the semiconductor filling material 108 is less than a difference in concentration between the first and second dopants that have diffused into the semiconductor filling material 108. Consequently, the net doping in the semiconductor filling material 108 is defined by the difference between the first and second dopant concentrations N1, N2. In the example mentioned, the net doping assumes the conductivity type of the first dopants on account of the greater diffusion of the first dopants at least in a region of the semiconductor filling material 108, since there N1 is greater than N2. This means, however, that more second dopants than first dopants remain in a region of the semiconductor body 102 surrounding the first trench 104. Consequently, the region of the semiconductor body 102 surrounding the first trench 104 assumes the conductivity type of the second dopants on account of the greater diffusion of the first dopants. A change in the conductivity type and thus a transition between differently doped regions of the superjunction structure depend, inter alia, on the diffusion properties of the first and second dopants and can have a lateral offset with respect to a sidewall of the first trench 104.

In accordance with one exemplary embodiment, forming the trench structure comprises lining the second trench with a dielectric structure, which can comprise one or a plurality of dielectric materials, e.g. a thermally grown and/or deposited oxide. Moreover, forming the trench structure comprises forming a conductive material in the second trench. Exemplary materials for the conductive material comprise heavily doped semiconductor materials such as e.g. polycrystalline silicon and also metals or conductive metal compounds.

Figure 3A:
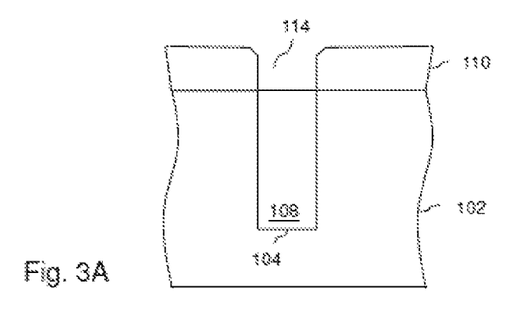
FIGS. 3A and 3B show schematic cross-sectional views of the semiconductor body for illustrating the formation of a second mask in a manner self-aligned with respect to a first mask.
Figure 3B:
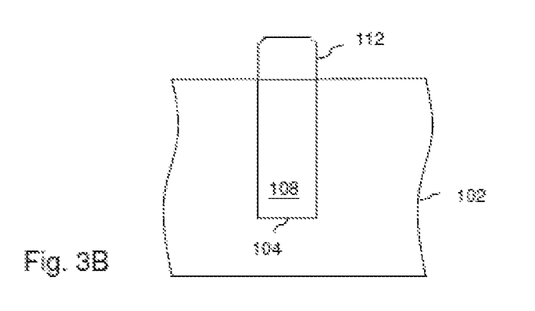

The cross-sectional views of the semiconductor body 102 as shown in FIGS. 3A and 3B illustrate one exemplary embodiment of the method in which the second mask 112 is formed in an inverted manner with respect to the first mask 110 with regard to opening and covering. By way of example, the second mask 112 comprises a mask material which can be etched selectively with respect to a mask material of the first mask 110. In this case, the first mask 110 can be constructed for example from a stack of different mask materials. Exemplary materials that can be removed selectively with respect to one another are nitrides and oxides, or carbon and suitable metals, or else amorphous silicon and crystalline or polycrystalline silicon. In accordance with one exemplary embodiment, the second mask 112 is formed by filling an opening 114 in the first mask 110 with a mask material of the second mask 112 and etching a mask material of the first mask 110 selectively with respect to the mask material of the second mask 112. In accordance with one exemplary embodiment, the first mask 110 and the second mask 112 are formed by exclusively photolithographic processing. This not only makes possible an improved scaling of the devices in the direction of smaller dimensions, i.e. an improved reduction of the device dimensions, but furthermore also holds out the prospect of a reduction in costs in view of a saved mask plane.

In accordance with one exemplary embodiment, an opening is formed in a mask material of the second mask in a manner self-aligned with respect to the second mask. By way of example, forming the opening in a self-aligned manner can be carried out by means of a selective etch.

In accordance with one exemplary embodiment, the opening in the second mask extends right into the semiconductor body. This makes possible an advantageous formation of a contact material which extends into the semiconductor body and which produces for example an electrical contact with the semiconductor material not only via a bottom region but also partly via a sidewall region. In accordance with one exemplary embodiment, the opening in the second mask is formed by at least two etching steps.

In accordance with one exemplary embodiment, the second trench is filled with a conductive material, wherein the conductive material is additionally formed on a surface of the second mask and is partly removed selectively with respect to a mask material of the second mask, in order to expose a top side of the second mask. The conductive material can be for example a gate electrode material, e.g. a heavily doped semiconductor material and/or a metal. Selectively removing the conductive material can be carried out for example by means of chemical mechanical polishing (CMP), wherein the CMP step ends when the top side of the second mask is reached.

In accordance with one exemplary embodiment, the opening in the second mask is filled with a filling material adjoining the semiconductor body. The filling material can be for example an electrical contact material comprising a heavily doped semiconductor material, a metal, a conductive metal compound or a combination. The filling material can form part of a source contacting.

In accordance with one exemplary embodiment, the method additionally comprises exposing a first surface of the semiconductor body by removing the second mask, a part of the trench structure and a part of the filling material. The method additionally comprises introducing different dopants through the exposed first surface into the semiconductor body in order to form a source region and a body region.

One exemplary embodiment of a method for producing a semiconductor device is explained in greater detail with reference to the schematic cross-sectional views in FIGS. 4A to 4O.

Figure 4A:
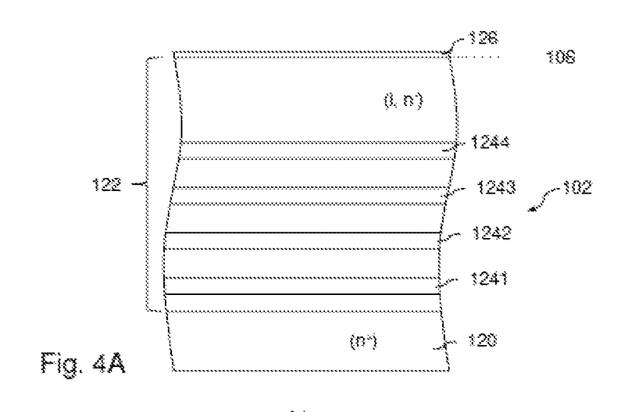
FIGS. 4A to 4O show schematic cross-sectional views of the semiconductor body for illustrating processing steps during the formation of a semiconductor device in accordance with one exemplary embodiment.

Referring to the schematic cross-sectional view in FIG. 4A, the semiconductor body 102 is provided, comprising an n$^+$-doped semiconductor substrate 120 and an intrinsic or weakly n-doped semiconductor layer formed thereon. The semiconductor layer comprises first dopants of a first conductivity type and second dopants of a second conductivity type. In the cross-sectional view illustrated, the first and second dopants have been introduced into different depth regions 1241, 1242, 1243, 1244 of the semiconductor layer 122 by a plurality of ion implantation steps having different energy. The number of four depth regions 1241, 1242, 1243, 1244 shown by way of example in the schematic cross-sectional view can, of course, also turn out to be smaller or larger. Depending on the depth region via which the first and second dopants are intended to be introduced, it is also possible to use a method in which epitaxy and implantation repeatedly alternate (so-called "multi-epi/multi-implant" method). Moreover, the first and/or second dopants can also be introduced partly or completely by in-situ doping. An optional ion implantation screen layer 126, e.g. a screen oxide, can be formed at the first surface 106 of the semiconductor body. The introduced doses of the first and second dopants are for example as explained in association with the exemplary embodiment in FIG. 2A.

Figure 4B:
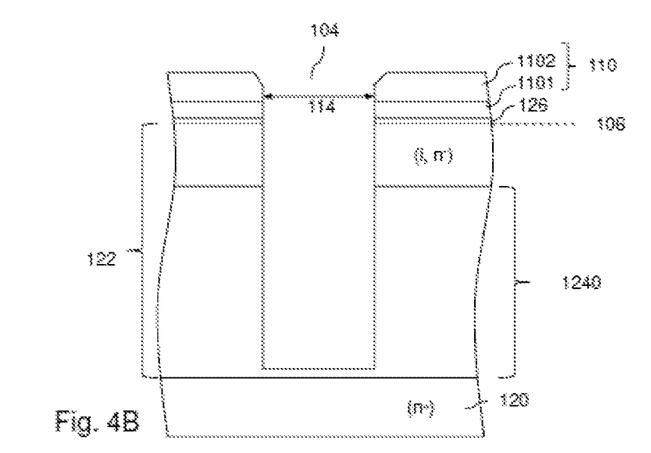

Referring to the schematic cross-sectional view in FIG. 4B, the semiconductor body 102 is subjected to a thermal treatment that leads to a vertical widening of the depth regions 1241, 1242, 1243, 1244 as a result of diffusion, thus giving rise to a depth region 1240 in which both the first and the second dopants are present. The depth region 1240 having the first and second dopants can for example extend as far as the first surface 106 or else, as shown by way of example in FIG. 4B, end below the first surface 106. The method additionally comprises forming the first trench 104 in the semiconductor body 102 by means of the first mask 110 having the opening 114. The first trench 104 can be formed for example by one or a combination of a plurality of etching processes, e.g. a physical dry etching method, a chemical dry etching method, a physico-chemical dry etching method such as reactive ion etching (RIE) or else a wet etching method. The first mask 110 consists of a layer stack and, in the exemplary embodiment illustrated, comprises first and second partial layers 1101, 1102 that are removable selectively with respect to one another. By way of example, the first partial layer 1101 can be a nitride layer and the second partial layer 1102 can be an oxide layer. The number of partial layers in the layer stack can also deviate from two. The first mask 110 is photolithographically patterned, for example.

Figure 4C:
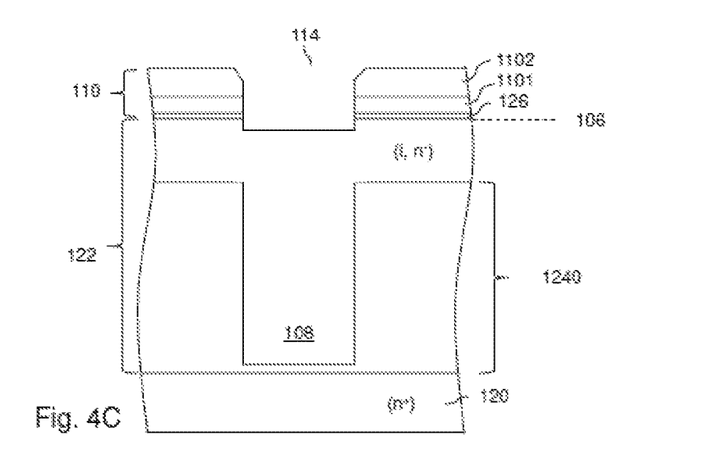

Referring to the schematic cross-sectional view in FIG. 4C, the first trench 104 is filled with the semiconductor filling material 108. The semiconductor filling material 108 can be produced for example by a layer deposition method such as chemical vapor deposition (CVD). By way of example, the trench is filled with the semiconductor filling material 108 by a method such as selective epitaxy, which makes possible the filling with the highest possible crystal quality, e.g. epitaxial growth on the side and bottom surfaces of the first trench 104. A total dopant concentration in the semiconductor filling material 108, in an average value determined over a vertical extent of the first trench 104, can be more than two, or more than three, or else more than four, orders of magnitude smaller than a corresponding total dopant concentration in a region of the semiconductor body 102 located next to the first trench 104, relative to the same vertical extent. The semiconductor filling material is thus an intrinsic semiconductor filling material, i.e. one that is doped only by impurities, but not intentionally, or else a weakly doped semiconductor filling material.

Figure 4D:
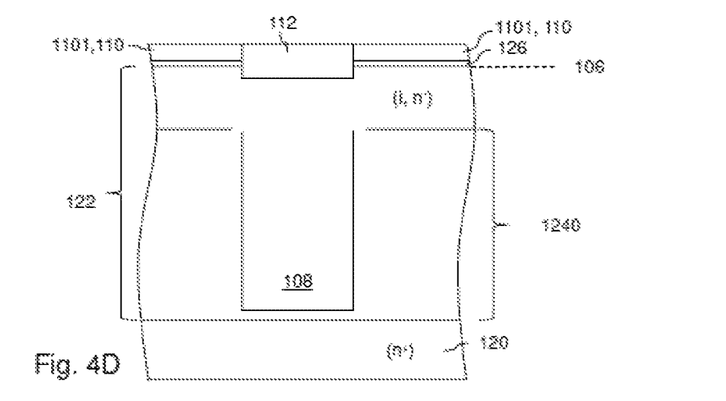

Referring to the schematic cross-sectional view in FIG. 4D, the opening 114 in the first mask 110 is filled with a material of the second mask 112, which material has a selective etchability with respect to the first partial layer 1101 of the first mask 110. By way of example, the material corresponds to the material of the second partial layer 1102 of the first mask 110. The second partial layer 1102 of the first mask and also partly the material of the second mask 112 are removed, e.g. by means of CMP with a stop when the first partial layer 1101 of the first mask 110 is exposed.

Figure 4E:
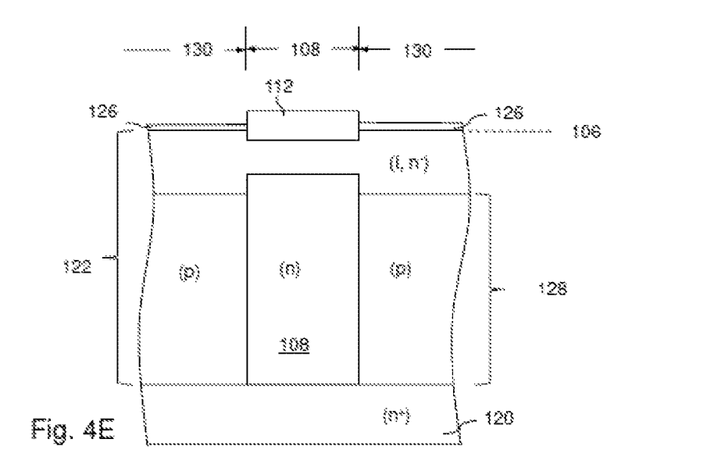

Referring to the schematic cross-sectional view in FIG. 4E, the second partial layer 1102 of the first mask 110 is removed selectively with respect to the material of the second mask 112, e.g. by means of a selective etching process. In addition, a superjunction structure 128 is formed by introducing a portion of the first dopants from a region 130 of the semiconductor body 102 into the semiconductor filling material 108. Introducing the portion of the first dopants can be carried out for example by means of a thermal budget which brings about a process of diffusion of the portion of the first dopants from the region 130 of the semiconductor body 102 into the semiconductor filling material 108. The thermal budget can be set for example by means of a heatable process chamber, e.g. a furnace, by means of temperature profile and duration. In view of the different diffusion coefficients of the first and second dopants and the different conductivity types of the first and second dopants, different amounts of first and second dopants pass into the semiconductor filling material. In the case of an approximately corresponding or only slightly deviating dose or average dopant concentration of the first and second dopants, this has the effect that a net doping of a conductivity type that is different than the conductivity type in the surrounding region of the semiconductor body arises in the semiconductor filling material. By way of example, if, as shown in FIG. 4E for example, more first than second dopants diffuse into the semiconductor filling material 108, then a net doping of the conductivity type of the first dopants arises in the semiconductor filling material 108. More second dopants than first dopants are present in the region 130 of the semiconductor body 102 surrounding the semiconductor filling material 108 and the net doping is of the conductivity type of the second dopants. An interface between the semiconductor filling material 108 and the semiconductor body 102 in the region 130 can deviate from a pn junction between the differently doped regions of the superjunction structure 128 and depends, inter alia, on the diffusion coefficients of the first and second dopants.

Figure 4F:
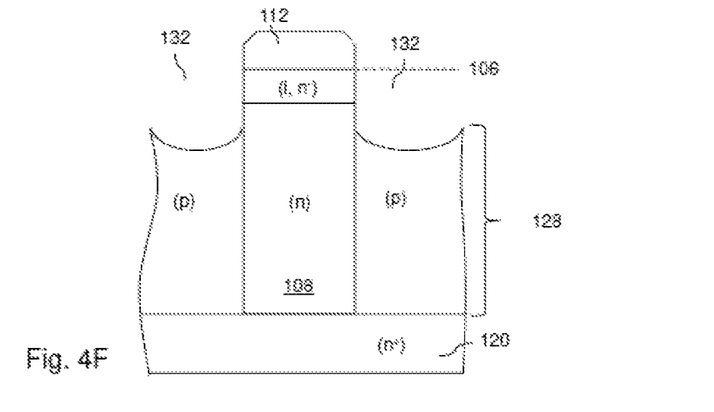

In the exemplary embodiment illustrated in FIG. 4F, a second trench 132 is produced in the semiconductor body 102 by means of the second mask 112, which was formed in a manner self-aligned with respect to the first mask 110. Forming the second mask 112 in a manner self-aligned with respect to the first mask 110 prevents a misalignment that arises if a mask is produced lithographically and is aligned relative to a previously produced other mask or structure formed therewith, e.g. by means of alignment marks. Consequently, only photolithography is required for producing the first mask 110 and the second mask 112 and the second mask 112 is produced for example on the basis of the first mask 110.

Like the first trench 104, too, the second trench 132 can be formed for example by one etching process or a combination of a plurality of etching processes, e.g. a physical dry etching method, a chemical dry etching method, a physico-chemical dry etching method such as reactive ion etching (RIE) or else a wet etching method.

Figure 4G:
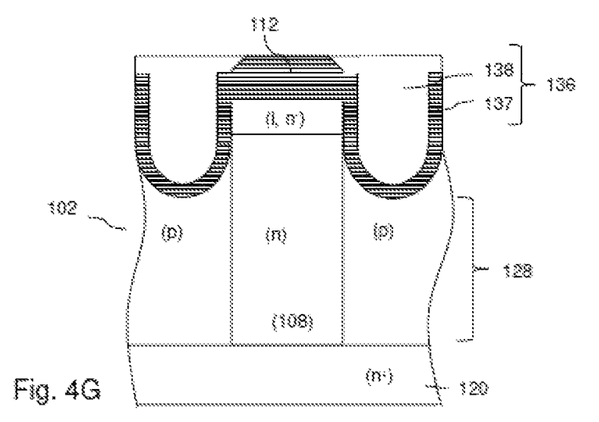

Referring to the schematic cross-sectional view in FIG. 4G, the ion implantation screen layer 126 is removed and a trench structure 136 is formed in the second trench 132. Forming the trench structure 136 can comprise for example forming a gate dielectric 137 in the second trench, e.g. by means of thermal oxidation/oxide deposition as TEOS (tetraethyl orthosilicate), and forming a gate electrode 138 in the second trench, e.g. by deposition of doped polycrystalline silicon. The trench structure can thus be formed for example as a gate trench structure of an IGFET. Excess material of the gate electrode 138 that deposits on the second mask, for example, can be removed again, e.g. by means of CMP.

Figure 4H:
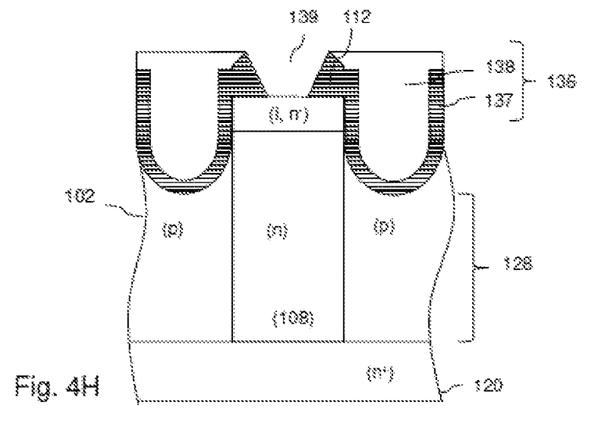

Referring to the schematic cross-sectional view in FIG. 4H, an opening 139 is formed in a material of the second mask 112 in a manner self-aligned with respect to the second mask 112. By way of example, the material of the second mask 112 is removed, e.g. etched, selectively with respect to the material of the gate electrode 138.

Figure 4I:
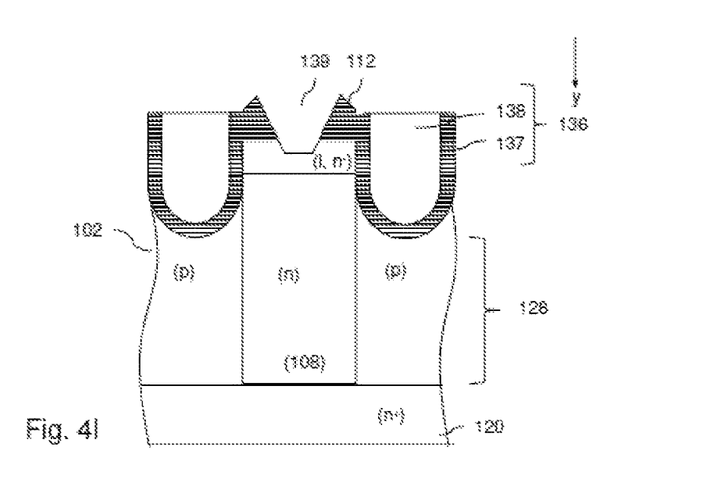

Referring to the schematic cross-sectional view in FIG. 4I, the opening 139 is enlarged, i.e. deepened, in a vertical direction y, such that it extends into the semiconductor body 102. By way of example, the opening 139 is deepened by a further etching step that removes a material of the semiconductor body 102 selectively with respect to the material of the second mask 112. In this case, a part of the material of the gate electrode 138 can also be removed, e.g. in the case of a gate electrode 138 formed from polycrystalline silicon and a semiconductor body 102 composed of silicon.

Figure 4J:
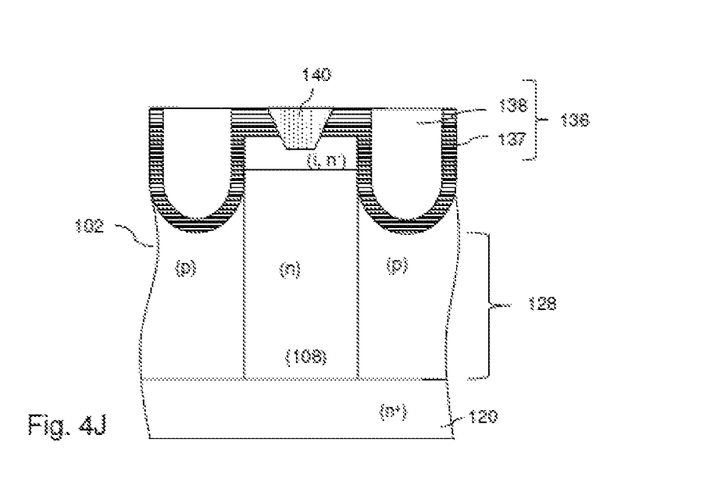

Referring to the schematic cross-sectional view in FIG. 4J, the opening 139 is filled with a filling material 140, which corresponds for example to the material of the second mask 112. Excess material that forms e.g. on the gate electrode 138 in a manner dictated by production can be removed again. By way of example, processing by CMP is suitable for this purpose.

Figure 4K:
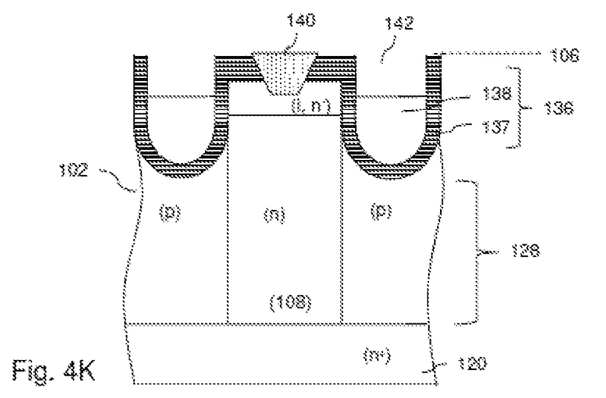
Figure 4L:
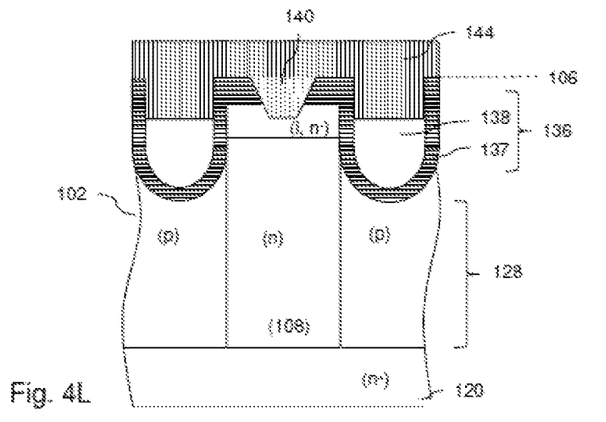

Referring to the schematic cross-sectional view in FIG. 4K, the material of the gate electrode 138 is caused to recede selectively with respect to the material of the second mask 112, e.g. by means of a selective etch. This gives rise to a cutout 142, which, as is illustrated with reference to the schematic cross-sectional view in FIG. 4L, is filled with a material 144, which for example corresponds to the material of the second mask 112 and can also deposit on the second mask 112 in a manner dictated by production.

Figure 4M:
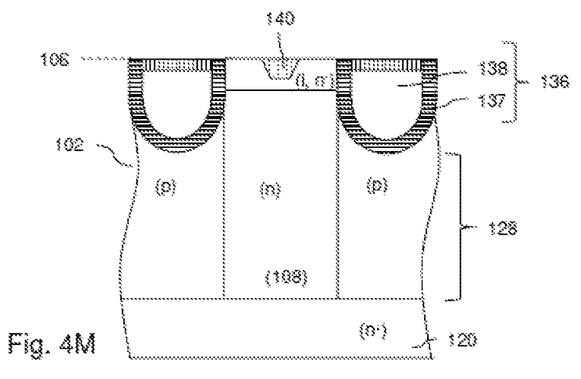

Referring to the schematic cross-sectional view in FIG. 4M, receding as far as the first surface 106 is effected, e.g. by means of CMP, such that the material 144, the second mask 112 and also a part of the filling material 140 are removed.

Figure 4N:
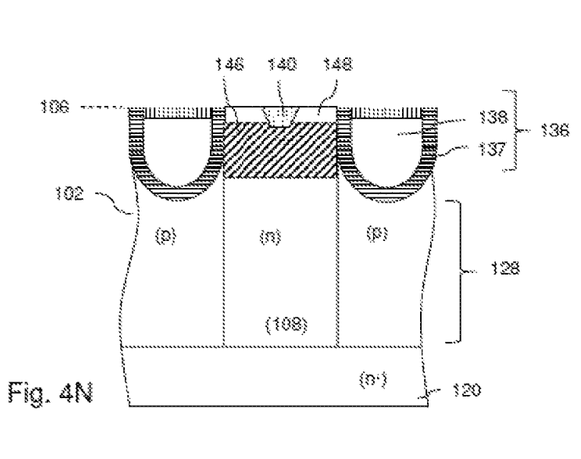

Referring to the schematic cross-sectional view in FIG. 4N, a p-doped body region 146 and an n$^+$-doped source region 148 are formed, e.g. by means of ion implantation and activation of p-type dopants in the case of the body region 146 and by means of ion implantation and activation of n-type dopants. It goes without saying that the n-type and also p-type dopants can be introduced into the semiconductor body 102 alternatively or supplementarily by other methods such as, for instance, diffusion from a diffusion source.

Figure 4O:
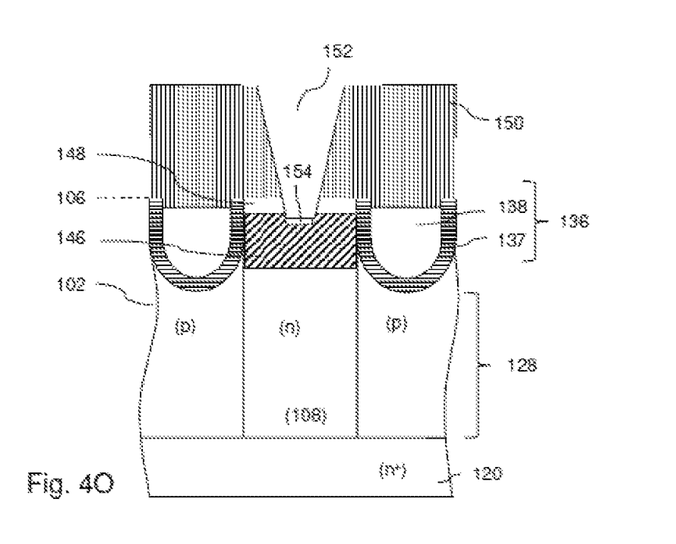

Referring to the schematic cross-sectional view in FIG. 4O, an interlayer dielectric 150 is formed on the first surface 106 and a contact opening 152 is formed, e.g. by means of photolithographic patterning of the interlayer dielectric 150. The interlayer dielectric 150 can be additionally opened for example simultaneously, at a location not illustrated in FIG. 4O for the electrical contacting of the gate electrode 138. A remnant of the filling material 140 is also removed by means of the formation of the contact opening 152. Depending on the dopant level of the body region 146, for example, a p$^+$-doped body contact region 154 can be formed in order to make possible a low-impedance electrical contacting of the body region 146.

Further conventional processing steps for completing the semiconductor device, e.g. forming a metallization and wiring region on the first surface 106 and forming a rear-side contact, are then carried out.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims, and the equivalents thereof.

The invention claimed is:

1. A method for producing a semiconductor device, the method comprising:
   providing a semiconductor body comprising first dopants of a first conductivity type and second dopants of a second conductivity type;
   forming a first trench in the semiconductor body via a first mask;
   filling the first trench with a semiconductor filling material;

forming a superjunction structure by introducing a portion of the first dopants from a region of the semiconductor body into the semiconductor filling material;

forming a second trench in the semiconductor body via a second mask, which is formed in a manner self-aligned with respect to the first mask; and forming a trench structure in the second trench.

2. The method of claim 1, wherein the first trench extends from a first surface of the semiconductor body vertically down to a depth d of the semiconductor body, and wherein a dopant concentration average value of the first dopants, which is determined along a vertical direction in a depth range of d/2 to d, deviates by less than 10% from a dopant concentration average value of the second dopants, which is determined along the vertical direction in the depth range of d/2 to d.

3. The method of claim 1, wherein a diffusion coefficient of the first dopants in the semiconductor body is greater than a diffusion coefficient of the second dopants in the semiconductor body, and wherein forming the superjunction structure comprises a thermal diffusion process which causes more first than second dopants to diffuse from the region of the semiconductor body into the semiconductor filling material, such that the semiconductor filling material is at least partly of the first conductivity type and the semiconductor body region is at least partly of the second conductivity type.

4. The method of claim 1, wherein forming the trench structure comprises:

lining the second trench with a dielectric structure; and forming a conductive material in the second trench.

5. The method of claim 1, wherein the second mask is formed in an inverted manner with respect to the first mask with regard to opening and covering.

6. The method of claim 5, wherein the second mask is formed by filling an opening in the first mask with a mask material of the second mask and etching a mask material of the first mask selectively with respect to the mask material of the second mask.

7. The method of claim 1, wherein the second mask comprises a mask material which is etchable selectively with respect to a mask material of the first mask.

8. The method of claim 7, wherein the second mask is formed by filling an opening in the first mask with a mask material of the second mask and etching a mask material of the first mask selectively with respect to the mask material of the second mask.

9. The method of claim 1, wherein the first mask and the second mask are formed exclusively by a photolithography process.

10. The method of claim 1, wherein an opening is formed in a mask material of the second mask in a manner self-aligned with respect to the second mask.

11. The method of claim 10, wherein the opening in the second mask extends into the semiconductor body.

12. The method of claim 11, wherein the opening in the second mask is formed by at least two etching steps.

13. The method of claim 10, wherein the second trench is filled with a conductive material, and wherein the conductive material is also formed on a surface of the second mask and partly removed selectively with respect to a mask material of the second mask, to expose a top side of the second mask.

14. The method of claim 10, wherein the opening in the second mask is filled with a filling material adjoining the semiconductor body.

15. The method of claim 14, further comprising:

exposing a first surface of the semiconductor body by removing the second mask, a part of the trench structure and a part of the filling material; and introducing different dopants through the exposed first surface into the semiconductor body to form a source region and a body region of opposite conductivity types.

16. The method of claim 1, wherein the first mask is formed as a layer stack composed of at least a first mask material and a second mask material such that the second mask material can be removed selectively with respect to the first mask material.

* * * * *